United States Patent [19]
Tang

[11] Patent Number: 6,143,649
[45] Date of Patent: Nov. 7, 2000

[54] METHOD FOR MAKING SEMICONDUCTOR DEVICES HAVING GRADUAL SLOPE CONTACTS

[75] Inventor: Sanh Dang Tang, Boise, Id.

[73] Assignee: Micron Technology, Inc., Boise, Id.

[21] Appl. No.: 09/019,009

[22] Filed: Feb. 5, 1998

[51] Int. Cl.[7] .................. H01L 21/311; H01L 21/44; H01L 21/441; H01L 21/4763

[52] U.S. Cl. .................. 438/640; 438/648; 438/649; 438/671; 438/672; 438/673; 438/701; 257/750; 257/754; 257/757; 257/761; 257/763; 257/764; 257/768; 257/770; 257/774

[58] Field of Search .................. 438/640; 257/774; 427/43.1; 156/643; 355/200; 148/105; 437/195

[56] References Cited

U.S. PATENT DOCUMENTS

| | | | |
|---|---|---|---|
| 4,508,749 | 4/1985 | Brannon et al. | 427/43.1 |
| 4,814,041 | 3/1989 | Auda | 156/643 |
| 4,970,553 | 11/1990 | Orlowski et al. | 355/200 |
| 5,269,880 | 12/1993 | Jolly et al. | 156/643 |
| 5,286,674 | 2/1994 | Roth et al. | 437/190 |
| 5,320,981 | 6/1994 | Blalock | 438/640 |
| 5,346,585 | 9/1994 | Doan et al. | 156/643 |
| 5,444,013 | 8/1995 | Akram et al. | 437/60 |
| 5,506,172 | 4/1996 | Tang | 437/189 |
| 5,585,285 | 12/1996 | Tang | 437/21 |
| 5,600,161 | 2/1997 | Gonzalez et al. | 257/306 |

Primary Examiner—Tom Thomas
Assistant Examiner—Bernard E. Souw
Attorney, Agent, or Firm—Killworth, Gottman, Hogan & Schaeff, L.L.P.

[57] ABSTRACT

The present invention is directed to a method for forming semiconductor devices and semiconductor device precursors having gradual slope contacts. The method for forming a semiconductor precursor includes the steps of: forming a layer of conductive material in a first layer; forming a layer of a hard mask material onto at least a portion of the first layer; etching the layer of hard mask material to expose a portion of the first layer; forming facets on the layer of hard mask material; and forming a via in the first layer such that the via extends through the first layer to expose at least a portion of the layer of conductive material.

4 Claims, 6 Drawing Sheets

METHOD FOR MAKING SEMICONDUCTOR DEVICES HAVING GRADUAL SLOPE CONTACTS

FIELD OF THE INVENTION

The present invention relates, in general, to contact etch processes and, more particularly, to sloped contact etch processes.

BACKGROUND OF THE INVENTION

Dynamic random access memory (DRAM) semiconductor devices and static random access memory (SRAM) semiconductor devices typically include an insulating layer of a dielectric material to electrically separate one conductive layer from another. Often, the two conductive layers are connected by means of a hole, commonly known as a "contact" or "via," in the insulating layer. Sometimes the via must have a sloped or faceted profile to provide proper step coverage of appropriate thickness of the conductive layer. Vertical contact profiles often result in unacceptable step coverage and excessively sloped profiles provide good step coverage but result in highly enlarged vias. Enlarged vias may cause electrical shorting between or within conductive layers and may also reduce the density of the circuit features by limiting the proximity of the devices. Thus, providing an adequate contact slope is critical to achieving acceptable contact step coverage.

U.S. Pat. No. 5,320,981 to Blalock describes a process for forming a sloped via. In this process, a photoresist mask is used to define an etch area on a dielectric layer. The dielectric layer is etched either isotropically or anisotropically to expose an underlying conductive layer. After the dielectric layer has been etched, the photoresist mask is removed and a second etch is performed. This second etch is a plasma etch and is conducted with a material, such as argon, krypton or xenon, so that as close as possible to a purely physical, as opposed to chemical, erosion takes place. The second etch forms a facet in the side walls of the via and redeposits the eroded dielectric material onto the opposite side wall.

However, when a photoresist material is used during etching of a via, particles of the photoresist material become deposited in the resulting via and on the conductive material. These particles of photoresist material affect the subsequent step coverage and the resulting conductivity of the semiconductor device. Further, plasma etching of a material is not a selective process and in the case of facet etching, portions of the semiconductor device other than the portion being facet etched may be damaged. Thus, a need still exists in the art for a process for forming a semiconductor devices having a gradual slope contact.

SUMMARY OF THE INVENTION

The present invention meets the current needs in the art by providing a method for forming semiconductor devices having gradual slope contacts. The present invention also provides a variety of semiconductor devices having gradual slope contacts.

One aspect of the present invention is directed to a method for making a semiconductor device precursor. The method comprises the steps of: forming a layer of conductive material in a first layer; forming a layer of a hard mask material onto at least a portion of the first layer; etching the layer of hard mask material to expose a portion of the first layer; forming facets on the layer of hard mask material; and forming a via in the first layer such that the via extends through the first layer to expose at least a portion of the layer of conductive material.

Another aspect of the present invention is directed to a method for forming a semiconductor device precursor. The method comprises the steps of: forming a layer of conductive material in a first layer; forming a layer of a hard mask material onto at least a portion of the first layer; forming a layer of etch resistant material on the layer of hard mask material; patterning the layer of etch resistant material; etching the layer of hard mask material to expose at least a portion of the first layer; forming facets on the layer of hard mask material; and forming a via in the first layer such that the via extends through the first layer to expose at least a portion of the layer of conductive material.

Still another aspect of the present invention is directed to a method for forming a semiconductor device precursor. The method comprises the steps of: forming a layer of conductive material in a first layer; forming a layer of a hard mask material onto at least a portion of the first layer; forming a layer of etch resistant material on the hard mask material; patterning the layer of etch resistant material; etching the layer of hard mask material to expose at least a portion of the first layer and to form opposing sidewalls in at least a portion of the first layer; bombarding the hard mask material with an ion source to form facets; depositing a portion of the material removed from the layer of hard mask material on opposite sidewalls of the first layer; forming a via in the first layer such that the via extends through the first layer to expose at least a portion of the layer of conductive material.

Yet another aspect of the present invention is directed to a method for forming a semiconductor device. The method comprises the steps of: forming a layer of conductive material in a first layer; forming a layer of a hard mask material onto at least a portion of the first layer; etching the layer of hard mask material to expose at least a portion of the first layer and to provide the hard mask material with facets; forming a via in the first layer such that the via extends through the first layer to expose at least a portion of the layer of conductive material; and forming a metal interconnect in the via, the metal interconnect contacting at least a portion of the layer of conductive material.

A further aspect of the present invention is directed to a semiconductor device precursor having a gradual slope contact formed by the method comprising the steps of: forming a layer of conductive material in a first layer; forming a layer of a hard mask material onto at least a portion of the first layer; etching the layer of hard mask material to expose a portion of the first layer; forming gradual slope contact on the layer of hard mask material; and forming a via in the first layer, the via extending through the first layer to expose at least a portion of the layer of conductive material.

Another aspect of the present invention is directed to a semiconductor device precursor having a gradual slope contact formed by the method comprising the steps of: forming a layer of conductive material in a first layer; forming a layer of a hard mask material onto at least a portion of the first layer; forming a layer of etch resistant material on the layer of hard mask material; patterning the layer of etch resistant material; etching the layer of hard mask material to expose at least a portion of the first layer; forming gradual slope contact on the layer of hard mask material; and forming a via in the first layer, the via extending through the first layer to expose at least a portion of the layer of conductive material.

Still another aspect of the present invention is directed to a semiconductor device precursor having a gradual slope contact formed by the method comprising the steps of: forming a layer of conductive material in a first layer; forming a layer of a hard mask material onto at least a portion of the first layer; forming a layer of etch resistant material on the hard mask material; patterning the layer of etch resistant material; etching the layer of hard mask material to expose at least a portion of the first layer and to form opposing sidewalls in at least a portion of the first layer; bombarding the hard mask material with an ion source to form a gradual slope contact; depositing a portion of the material removed from the layer of hard mask material on opposite sidewalls of the first layer; forming a via in the first layer, the via extending through the first layer to expose at least a portion of the layer of conductive material.

Yet another aspect of the present invention is directed to a semiconductor device having a gradual slope contact formed by the method comprising the steps of: forming a layer of conductive material in a first layer; forming a layer of a hard mask material onto at least a portion of the first layer; etching the layer of hard mask material to provide the hard mask material with a gradual slope contact; forming a via in the first layer, the via extending through the first layer to expose at least a portion of the layer of conductive material; and forming a metal interconnect in the via, the metal interconnect contacting at least a portion of the layer of conductive material.

A further aspect of the present invention is directed to a method for making a semiconductor device having a gradual slope contact comprising the steps of: forming a layer of dielectric material on a substrate, wherein the dielectric material is selected from the group consisting of silicon oxide, silicon nitride and polyimide film and wherein the substrate is selected from the group consisting of aluminum, copper and polycrystalline silicon; forming a layer of conductive material within the layer of dielectric material, the layer of conductive material being surrounded by the layer of dielectric material; depositing a layer of hard mask material on the layer of dielectric material, the hard mask material being selected from the group consisting of tungsten, tungsten silicide, polycrystalline silicon, titanium, titanium nitride, titanium silicide and titanium-tungsten alloys; forming a photoresist layer on the layer of hard mask material; exposing the photoresist layer to form a pattern on the photoresist layer; etching the layer of hard mask material according to the pattern on the photoresist layer to expose the layer of dielectric material and to form sidewalls in the exposed portion of the layer of dielectric material; removing the photoresist layer; anisotropically etching the layer of hard mask with an inert material to form gradual slope contact on the layer of hard mask material; depositing the hard mask material removed by the anisotropic etching onto the sidewalls of the exposed layer of dielectric material to form a gradual slope contact; etching the dielectric material to expose a portion the conductive layer; and forming a metal interconnect with the exposed portion of the conductive layer, wherein the metal which forms the metal interconnect is selected from the group consisting of aluminum, copper, gold, aluminum-titanium alloys and aluminum-copper alloys.

A further aspect of the present invention is directed to a semiconductor device precursor. The semiconductor device precursor includes a substrate. A layer of dielectric material is formed on at least a portion of the substrate. A layer of conductive material is formed within the layer of dielectric material so that the layer of conductive material contacts at least a portion of the substrate. A layer of hard mask material is formed on at least a portion of the layer of dielectric material. The layer of hard mask material has a pair of facets formed therein by anisotropic etching. The facets and the layer of dielectric material define a via which exposes at least a portion of the layer of conductive material.

A still further aspect of the present invention is directed to a semiconductor device. The semiconductor device includes a substrate. A layer of dielectric material is formed on at least a portion of the substrate. A layer of conductive material is formed within the layer of dielectric material such that the layer of conductive material contacts at least a portion of the substrate. A layer of hard mask material is formed on at least a portion of the layer of dielectric material. The layer of hard mask material has facets formed therein by anisotropic etching. The facets and the layer of dielectric material define a via which exposes at least a portion of the layer of conductive material. Finally, an interconnect material is formed in the via.

Accordingly, it is an object of the present invention to provide a method for forming a semiconductor having a gradual slope contact which increases the step coverage and resulting conductivity of the semiconductor device. Other objects and advantages of the invention will be apparent from the following detailed description, the accompanying drawings and the appended claims.

DETAILED DESCRIPTION OF THE INVENTION

For the purposes of the present application, the preposition "on" refers to formation in contact with the surface of a particular layer, while "over" refers to a formation above or in contact with a surface of a particular layer.

Figure 1:
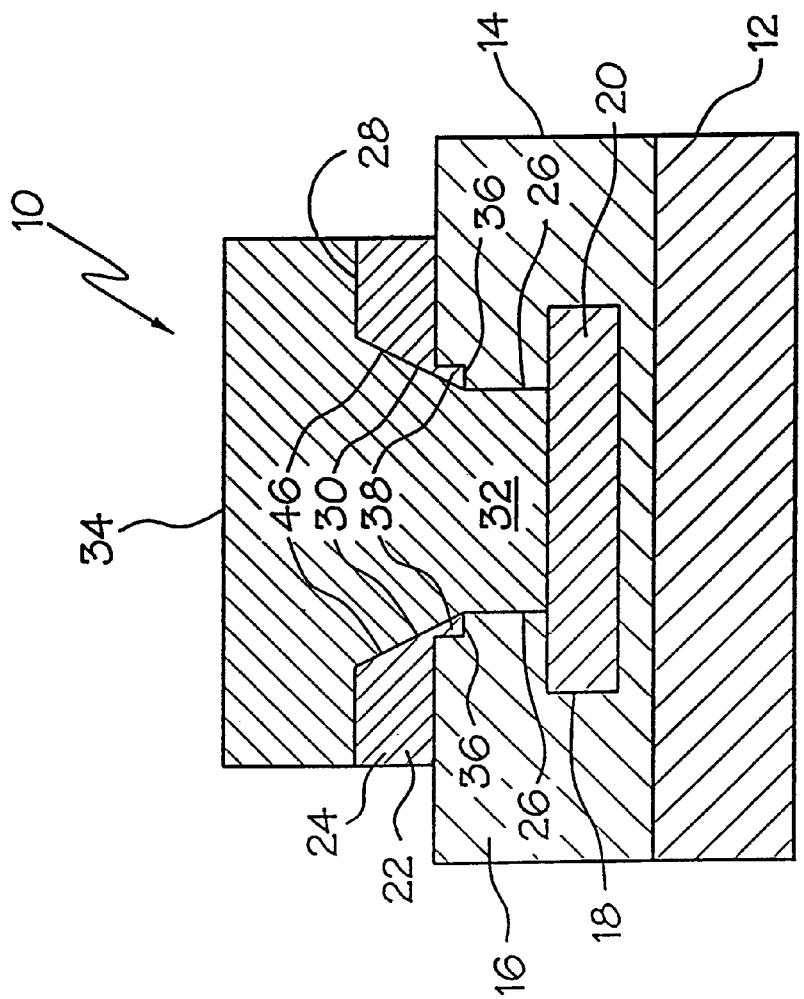
FIG. 1 presents a cross sectional view of a semiconductor device of the present invention.

A semiconductor device 10 formed according to the process of this invention is shown in FIG. 1. The device 10 includes a substrate 12 on which a layer 14 is formed. A layer 18 of conductive material 20 is positioned over the substrate 12. The layer 18 of conductive material 20 is formed in the layer 14 and is desirably surrounded by the layer 14. The layer 18 of conductive material 20 may also be positioned on the substrate 12. A layer 22 of a hard mask material 24 is formed on the layer 14. The layer 14 has a pair of side walls 26 formed therein. The layer 22 of hard mask material 24 has a planar surface 28 and has facets 30 formed therein. The side walls 26 in the layer 14 and the facets 30 in the layer 22 of hard mask material 24, together, define a via 32. A metal interconnect 34, which contacts at least a portion of the layer 18 of conductive material 20, is formed in the via 32. The facets 30 form gradual slope contacts 46 with the metal interconnect 34. The layer 14 also has a pair of shoulders 36 formed therein. The shoulders 36 are covered with a deposit 38 of hard mask material 24.

The substrate 12 is formed from any material currently in use in the art which is used to form substrates for semiconductor devices such as semiconductor device 10. Useful materials include, but are not limited to, doped or undoped silicon, doped or undoped polycrystalline silicon, gallium arsenide, gallium phosphide and indium phosphide.

The layer 14 is desirably an insulating material 16 which can be any material currently in use in the art as an insulator or a dielectric. Useful insulating materials 16 include, but are not limited to, tetraethyl orthosilicate (TEOS), nitrides, oxides and polyimides.

The conductive material 20 is any material which conducts an electric current. Useful materials include, but are not limited to, polycrystalline silicon, aluminum, copper, aluminum-copper alloys, aluminum-titanium alloys and gold. Desirably, the conductive material 20 is an aluminum-copper alloy.

The hard mask material 24 is formed from any material which does not produce polymeric residues during an etching process and which is not removed by solvents used to remove photoresist materials from the surface of semiconductor precursor or device. Materials useful for forming the layer 22 of hard mask material 24 include, but are not limited to, tungsten, tungsten silicide, polycrystalline silicon, silicon nitride, titanium, titanium nitride, titanium silicide, and titanium-tungsten alloys.

The metal interconnect 34 is formed from any material currently in use in the art which conducts an electric current. Useful materials include, but are not limited to, polycrystalline silicon, aluminum, copper, aluminum-copper alloys, aluminum-titanium alloys and gold. Desirably, the conductive metal interconnect 28 is formed from an aluminum-copper alloy.

Figure 2:
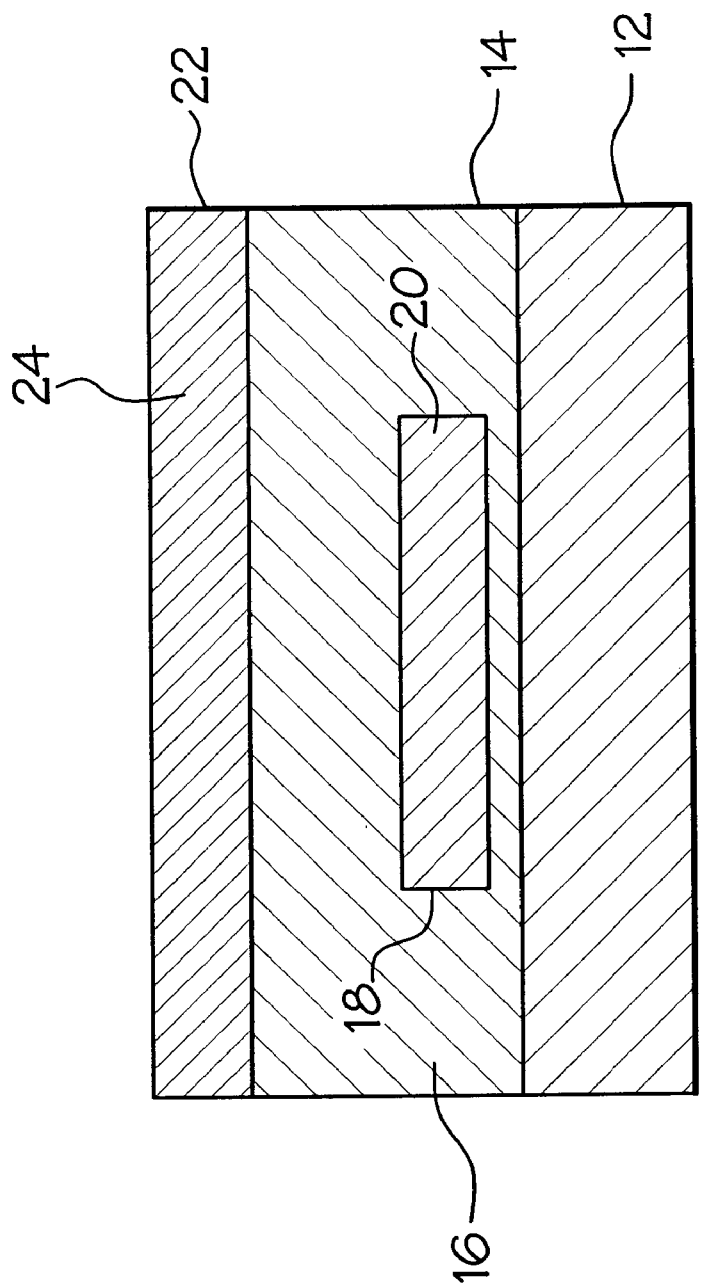
FIG. 2 presents a cross sectional view depicting the formation of a semiconductor device formed by the method of the present invention.

The semiconductor device 10 is formed by the following process. As shown in FIG. 2, the layer 14 is formed on at least a portion of the substrate 12 by any conventional deposition or forming process. Next, the layer 18 of conductive material 20 is formed in the layer 14 and is positioned over or on the substrate 12. The layer 18 of conductive material 20 is formed so that it is surrounded by the layer 14 at least on three sides, or is surrounded on all sides if the layer 18 of conductive material 20 does not contact the substrate 12. For example, the layer 18 of conductive material 20 can be formed in the following manner. After the layer 14 has been formed on the substrate 12, a layer of a photoresist material is formed on the layer 14. The photoresist layer is then patterned and etched by conventional processes to form an area in which the layer 18 of conductive material 20 can be formed. The layer 18 of conductive material 20 is then formed in the area. After the layer 18 of conductive material 20 has been formed in the area, the layer 14 is formed over the layer 18 of conductive material 20 to surround the layer 18 of conductive material 20.

After the layer 18 of conductive material 20 has been formed in the layer 14, the layer 22 of the hard mask material 24 is deposited on at least a portion of the layer 14. The layer 22 of hard mask material 24 is deposited by any conventional means used to deposit a metallic material onto a substance. Useful methods include chemical vapor deposition, evaporation and sputtering. Desirably, the layer 22 of hard mask material 24 is deposited by chemical vapor deposition. The layer 22 of hard mask material 24 can have any thickness and desirably has a thickness from about 500 Å to about 1000 Å.

Figure 3:
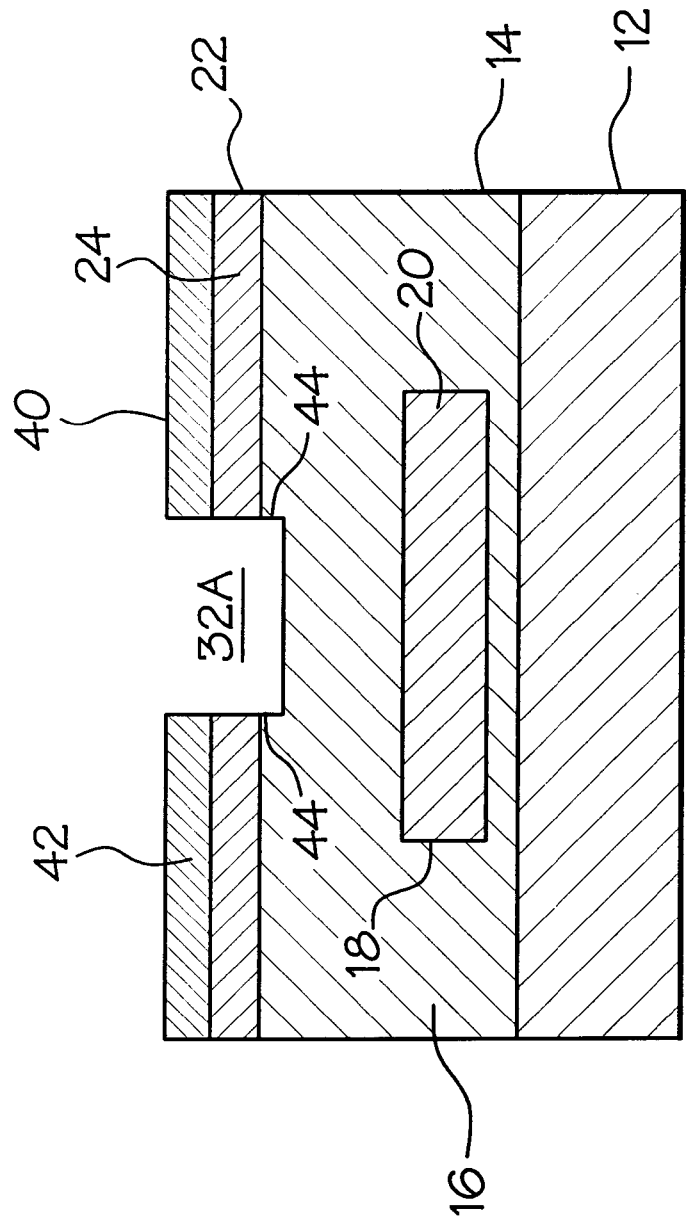
FIG. 3 presents a cross sectional view depicting the formation of a semiconductor device formed by the method of the present invention.

With reference to FIG. 3, once the layer 22 of hard mask material 24 has been deposited on the layer 14, a layer 40 of an etch resistant material 42 is formed on at least a portion of the layer 22 of hard mask material 24. The etch resistant material 42 is any conventional material used in semiconductor etching processes. Desirably, it is a photoresist material. After the layer 40 of etch resistant material 42 has been formed on the layer 22 of hard mask material 24, the layer 40 of etch resistant material 42 is patterned or exposed in a conventional manner. The layer 22 of hard mask material 24 is then etched according to the pattern. The layer 22 can be etched either isotropically or anisotropically. An isotropic etch can be performed using hydrofluoric acid or any other acid currently used in the art to wet etch semiconductor substrates. Desirably, the layer 22 is anisotropically etched using a gas plasma etch, an ion beam etch, or a reactive ion etch to avoid the formation of a retrograde profile which often results from the use of isotropic etching processes. More desirably, the layer 22 of hard mask material is plasma etched.

The etch is performed so that the layer 22 of hard mask material 24 is etched through its entire thickness to expose at least a portion of the layer 14. As shown in FIG. 3, a slight over etching desirably takes place and results in a portion of the layer 14 also being etched. This over etching is desirable to ensure that the layer 22 of hard mask material 24 has been etched through its entire thickness. By etching through the layer 22 of hard mask material 24 and into the layer 14, a partial via 32A having sidewalls 44 is formed in the layer 22 of hard mask material 24 and, desirably, into the layer 14. This etching process produces the sidewalls 44 of the partial via 32A. After the etching of the layer 22 of hard mask material 24 has been completed, the layer 40 of etch resistant material 42 is removed from the surface of the layer 22 of hard mask material 24. The layer 40 of etch resistant material 42 can be removed from the surface of the layer 22 in any conventional manner known in the art.

Figure 4:
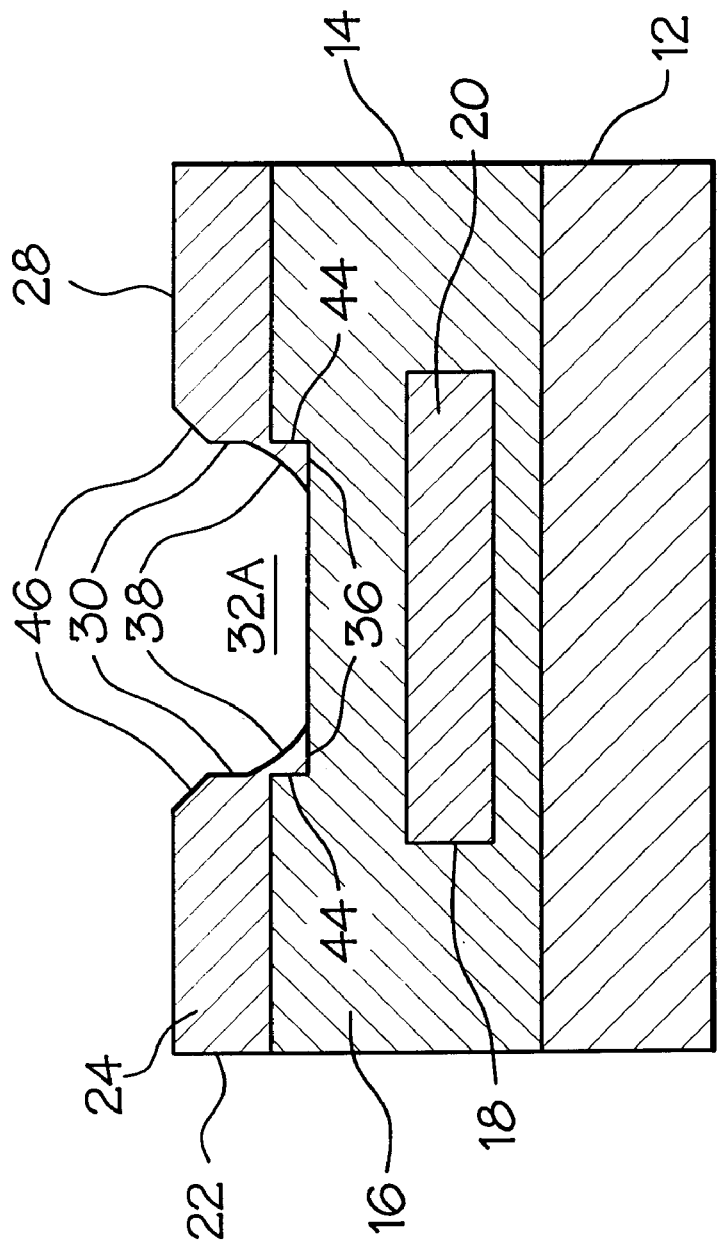
FIG. 4 presents a cross sectional view depicting the formation of a semiconductor device formed by the method of the present invention.

With reference to FIG. 4, once the layer 40 of etch resistant material 42 is removed, the facets 30 in layer 22 of hard mask material 24 are formed. The facets 30 are formed by an anisotropic etching process. In this type of etching process, a workpiece is placed on the powered electrode of a reactive ion etcher, a plasma etcher or other suitable apparatus capable of accelerating ions toward an object with high energy.

The facet etch used in the present invention has a basis in the physical nature of the reaction, more specifically, in an ion bombardment. This type of facet etching is most effective when performed in a chamber in which ions can be accelerated to strike the workpiece. Such chambers are known in the art, and include, but are not limited to, reactive ion etchers, desirably magnetically enhanced reactive ion etchers, and high density source etchers.

In an ion etching or plasma etching process, ions which impinge a surface of a workpiece positioned perpendicularly to the impinging ions have a minimal effect on etch rate and profile. However, ions striking the corners of the workpiece etch at a rate which is about four times that of a surface of the workpiece which lays perpendicular to the path of the impinging ions. This etch creates the gradual slope contacts 46 at the corners of the layer 22 of hard mask material 24.

The etching process wears away the corners of the layer 22 at approximately 45° angles.

Figure 5:
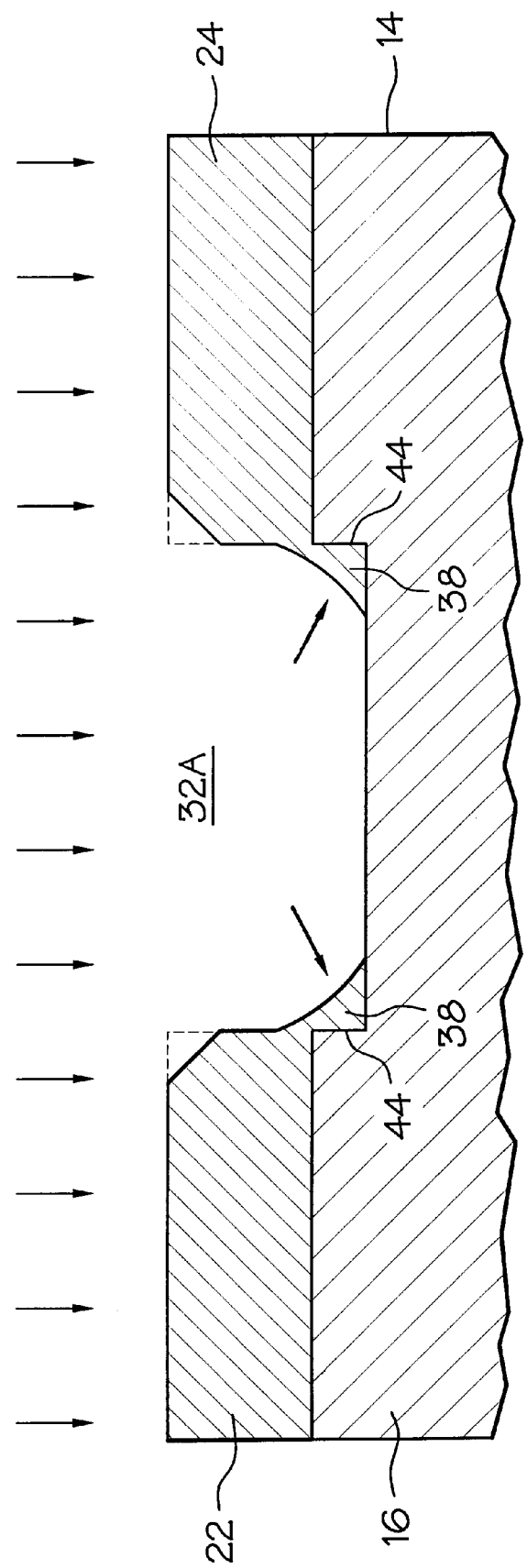
FIG. 5 presents a schematic diagram of the angle of ion impingement on a material used in the manufacture of semiconductor devices and the consequent shape of the structures upon removal.

As shown in detail in FIG. 5, the material removed from the corners of the layer 22 of hard mask material 24 is redeposited along the sidewalls 44 of the partial via 32A to form the deposits 38. The deposits 38 further increase the slope of the gradual slope contact 46 without widening the via 32. The deposits 38 result from the etch redepositing the removed hard mask material 24 onto the opposite sidewall 26 from the side from which it was removed.

The facet etch is desirably performed by placing a workpiece in a high vacuum reactor on a cathode for which a power source creates a radio frequency (RF) of 13.56 Mhz, while controlling the introduction of etchant gases. The walls of the reactor are grounded to allow for a return RF path. This chamber configuration is generally referred to as a reactive ion etcher. The RF power source creates a plasma condition in the chamber, thereby allowing for the creation of charged particles or ions. Due to the physics of the RF powered electrode, a direct current self-bias voltage condition is created at the workpiece location. This self-bias condition directs the charged particles or ions toward the workpiece in a direction perpendicular to the workpiece's surface.

Typical parameters for facet etching using an Applied Materials 5000 Series apparatus or a LAM Research Technologies LAM PCP apparatus are as follows:

RF Power: about 300 watts to about 700 watts;

Pressure: about 10 mtorr to about 30 mtorr; and

Etchant: about 30 sccm to about 70 sccm.

Inert gases, including, but not limited to, argon, helium and xenon are effective etchant gases for performing the facet etch. The inert gas tends to further enhance the uniformity of the facet etch process. An inert gas is used so that the etch of the layer 22 of hard mask material 24 is as close to being a nonchemical etch as possible. In other words, it is desirable that this be as close as possible to being a purely mechanical etch. Argon is desired because of its weight and commercial availability but other inert gases may be used. The facet etch can also be performed with any other suitable gas which is inert with respect to the layer 22 of hard mask material 24 and the layer 14.

Figure 6:
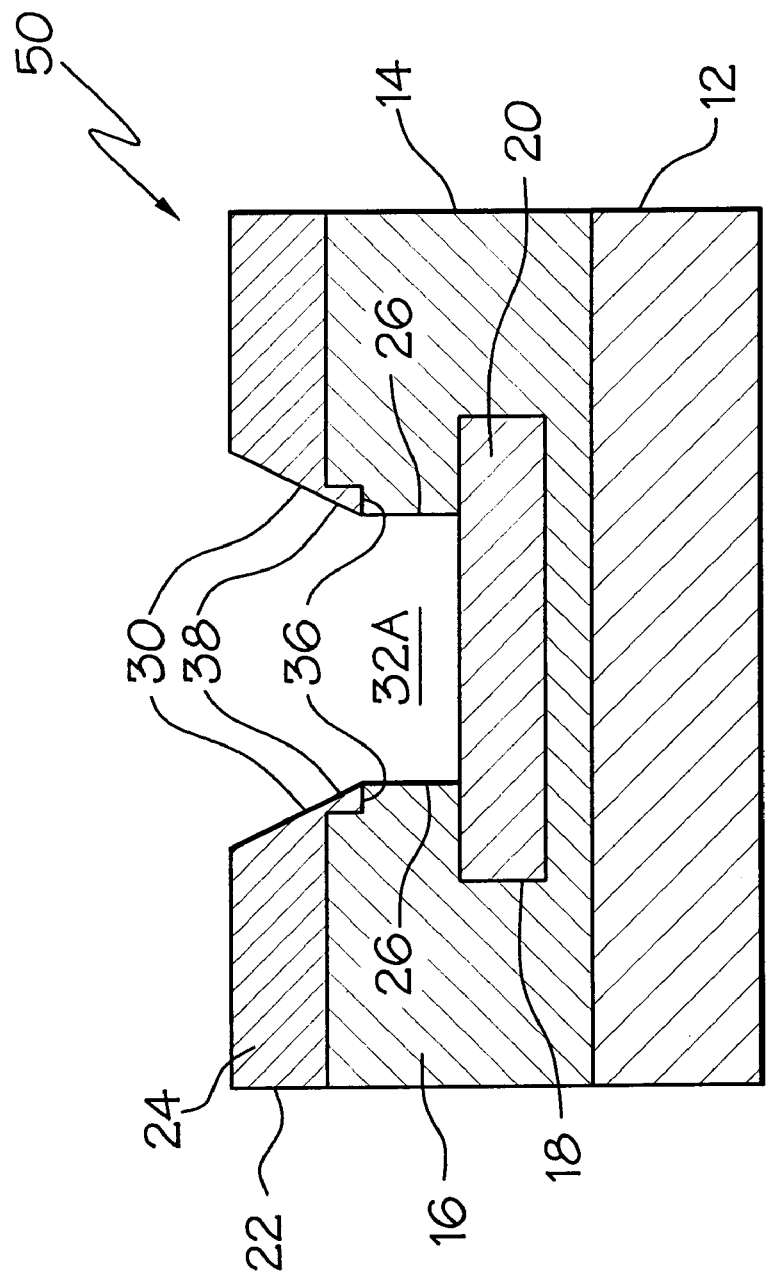
FIG. 6 presents a cross sectional view of a semiconductor device precursor formed by the method of the present invention.

After the facets 30 have been formed in the layer 22 of hard mask material 24, the layer 14 is etched to expose at least a portion of the layer 18 of conductive material 20, as shown in FIG. 6, and to form a semiconductor device precursor 50. The precursor 50 includes the substrate 12 on which the layer 14 has been formed. The layer 18 of conductive material 20 is formed within the layer 14 and is surrounded by the layer 14. Desirably, the layer 18 of conductive material contacts at least a portion of the substrate 12. As shown in FIG. 6, the layer 22 of hard mask material 24 is formed on the layer 14. The layer 22 of hard mask material 24 has the facets 30 formed thereon. The facets 30 and the sidewalls 26, together, define the via 32.

The precursor 50 is formed by etching the layer 14. The layer 14 is etched either isotropically or anisotropically. An isotropic etch is performed using hydrofluoric acid or any other acid currently used in the art to wet etch dielectric materials. Desirably, the layer 14 is anisotropically etched using a plasma etch, an ion beam etch or a reactive ion etch. More desirably, the layer 14 is plasma etched. This etching forms the via 32 which is narrower than the partial via 32A formed when the layer 22 of hard mask material 24 is etched. This is due to the fact that the facet etching of the layer 22 of the hard mask material 24, which forms the facets 30, also narrows the via 32 through the redeposit of the deposited material 38 along the sidewalls 44 of the partial via 32A. The narrowing of the via 32 forms the shoulders 36 which have the deposited material 38 redeposited thereon.

After the via 32 has been formed, the metal interconnect 34 can be formed in the via 32 to complete the semiconductor device 10, as shown in FIG. 1. The metal interconnect 34 is formed to contact the gradual slope contacts 46 and to contact at least a portion of the layer 18 of conductive material 20. Desirably, the metal interconnect 34 will be formed from the same material as the layer 18 of conductive material 20.

Before forming the metal interconnect 34 in the via 32, the via 32 may optionally be cleaned of any polymeric material which may have built up in the via 32 during the previous etching processes. To clean any polymer build up, a mixture of tetrafluoromethane and oxygen gases is blown at a high temperature into the via 32. This causes any built up polymeric material to burn making it easier to remove the polymeric material with a diluted solution of a mineral acid. However, because the process of the present invention removes the etch resistant material 38, which is the primary cause of polymer build up in the via 32, prior to etching of the via 32, such a cleaning step should be unnecessary. If it is necessary, the amount of cleaning required is greatly reduced by the process of the present invention as compared to prior art methods.

After the metal interconnect 34 has been formed in the via 32, the portion of the layer 22 of hard mask material 24 which is not covered by the metal interconnect 34 may be removed. If the layer 22 of hard mask material 24 is formed from a conductive material, then the portions of layer 22 which extend beyond the edges of the metal interconnect 34 must be removed to prevent the layer 22 from acting as a conductive bridge between adjacent interconnects 34. The portions of the layer 22 of hard mask material 24 which extend beyond the edges of the metal interconnect 34 can be removed by means of either an isotropic or an anisotropic etching process, such as those described above. However, if the layer 22 of hard mask material 24 is not formed from a conductive material, it is not necessary to remove the exposed portions of the layer 22 of hard mask material 24. Further, if the layer 22 of hard mask material 24 is not formed from a conductive material, it may be left in place to protect the underlying layers.

A person of skill in the art will appreciate that the aspect ratio of the via 32 can be varied by increasing or decreasing the thickness of the layer 14 and/or the layer 22 of hard mask material 24.

The semiconductor device 10 of the present invention can be any semiconductor device currently in use in the art. The device 10 can be used as a capacitor, a DRAM, or an SRAM.

Having described the invention in detail and by reference to preferred embodiments thereof, it will be apparent that modifications and variations are possible without departing from the scope of the invention which is defined in the appended claims.

What is claimed is:

1. A method for making a semiconductor device having a gradual slope contact comprising the steps of:

forming a layer of dielectric material on a substrate, wherein said dielectric material is selected from the group consisting of silicon oxide, silicon nitride and polyimide film and wherein said substrate is selected from the group consisting of aluminum, copper and polycrystalline silicon;

forming a layer of conductive material within said layer of dielectric material, said layer of conductive material being surrounded by said layer of dielectric material;

depositing a layer of hard mask material on said layer of dielectric material, said hard mask material being selected from the group consisting of tungsten, tungsten silicide, polycrystalline silicon, titanium, titanium nitride, titanium silicide and titanium-tungsten alloys;

forming a photoresist layer on said layer of hard mask material;

exposing said photoresist layer to form a pattern on said photoresist layer;

etching said layer of hard mask material according to said pattern on said photoresist layer to expose said layer of dielectric material and to form sidewalls in said exposed portion of said layer of dielectric material;

removing said photoresist layer;

anisotropically etching said layer of hard mask with an inert material to form gradual slope contacts on said layer of hard mask material;

redepositing eroded hard mask material from said anisotropic etching step onto said sidewalls of said exposed layer of dielectric material;

etching said dielectric material to expose a portion said layer of conductive material; and forming a metal interconnect with said exposed portion of said conductive layer, wherein said metal interconnect is selected from the group consisting of aluminum, copper, gold, aluminum-titanium alloys and aluminum-copper alloys.

2. A method for forming a semiconductor device precursor comprising the steps of:

forming a layer of conductive material in a first layer;

forming a layer of a hard mask material onto at least a portion of said first layer, said hard mask material comprising a material which does not produce polymeric residue during etching and which is not removed by solvents used to remove photoresist materials from the surface of said semiconductor device precursor, and wherein said hard mask material is selected from the group consisting of tungsten, tungsten silicide, polycrystalline silicon, titanium, titanium nitride, titanium silicide, and titanium-tungsten alloys;

etching said layer of hard mask material to expose a portion of said first layer;

forming facets on said layer of hard mask material; and forming a via in said first layer, said via extending through said first layer to expose at least a portion of said layer of conductive material.

3. A method for forming a semiconductor device precursor comprising the steps of:

forming a layer of conductive material in a first layer;

forming a layer of a hard mask material onto at least a portion of said first layer, said hard mask material comprising a material which does not produce polymeric residue during etching and which is not removed by solvents used to remove photoresist materials from the surface of said semiconductor device precursor, and wherein said hard mask material is selected from the group consisting of tungsten, tungsten silicide, polycrystalline silicon, titanium, titanium nitride, titanium silicide and titanium-tungsten alloys;

forming a layer of etch resistant material on said layer of hard mask material;

patterning said layer of etch resistant material;

etching said layer of hard mask material to expose at least a portion of said first layer;

forming facets on said layer of hard mask material; and forming a via in said first layer, said via extending through said first layer to expose at least a portion of said layer of conductive material.

4. A method for forming a semiconductor device comprising the steps of:

forming a layer of conductive material in a first layer;

forming a layer of a hard mask material onto at least a portion of said first layer, said hard mask material comprising a material which does not produce polymeric residue during etching and which is not removed by solvents used to remove photoresist materials from the surface of said semiconductor device, and wherein said hard mask material is selected from the group consisting of tungsten, tungsten silicide, polycrystalline silicon, titanium, titanium nitride, titanium silicide and titanium-tungsten alloys;

etching said layer of hard mask material to expose at least a portion of said first layer and to provide said layer of hard mask material with facets;

forming a via in said first layer, said via extending through said first layer to expose at least a portion of said layer of conductive material; and forming a metal interconnect in said via, said metal interconnect contacting at least a portion of said layer of conductive material.

* * * * *